US011603769B2

(12) United States Patent
Craig et al.

(10) Patent No.: US 11,603,769 B2
(45) Date of Patent: Mar. 14, 2023

(54) FORMING LINED COOLING APERTURE(S) IN A TURBINE ENGINE COMPONENT

(71) Applicant: Raytheon Technologies Corporation, Farmington, CT (US)

(72) Inventors: Brian Craig, Palm Beach Gardens, FL (US); James M. Koonankeil, Marlborough, CT (US); Brian T. Hazel, Avon, CT (US); Paul E. Denney, Northborough, MA (US); Dominic J. Mongillo, West Hartford, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 0 days.

(21) Appl. No.: 17/401,906

(22) Filed: Aug. 13, 2021

(65) Prior Publication Data
US 2023/0051153 A1  Feb. 16, 2023

(51) Int. Cl.
*B23K 26/386* (2014.01)
*C23C 4/01* (2016.01)
*F01D 9/04* (2006.01)
*F01D 25/12* (2006.01)
*C23C 14/02* (2006.01)
*C23C 14/16* (2006.01)
*C23C 16/02* (2006.01)
(Continued)

(52) U.S. Cl.
CPC ............ *F01D 9/041* (2013.01); *B23K 26/386* (2013.01); *B23K 26/389* (2015.10); *C23C 4/01* (2016.01); *C23C 14/024* (2013.01); *C23C 14/028* (2013.01); *C23C 14/16* (2013.01); *C23C 16/0263* (2013.01); *C23C 16/0281* (2013.01); *C23C 16/06* (2013.01); *F01D 25/12* (2013.01); *B23P 2700/00* (2013.01); *F05D 2220/32* (2013.01); *F05D 2230/10* (2013.01); *F05D 2230/31* (2013.01); *F05D 2260/20* (2013.01)

(58) Field of Classification Search
CPC ........ B23K 26/386; B23K 26/389; C23C 4/01
See application file for complete search history.

(56) References Cited

U.S. PATENT DOCUMENTS 4,762,464 A    8/1988  Vertz
6,210,488 B1   4/2001  Bruce
(Continued)

FOREIGN PATENT DOCUMENTS

CN    111665806 A    9/2020
EP       985802 A    3/2000
(Continued)

OTHER PUBLICATIONS

EP-2918774-A1 English translation (Year: 2015).*
EP search report for EP22190370.1 dated Jan. 20, 2023.

*Primary Examiner* — Jason L Vaughan
*Assistant Examiner* — Amanda Kreiling
(74) *Attorney, Agent, or Firm* — Getz Balich LLC

(57) ABSTRACT

A manufacturing method is provided. During this method, a preform component is provided for a turbine engine. The preform component includes a substrate. A meter section of a cooling aperture is formed in the substrate. An internal coating is applied onto a surface of the meter section. An external coating is applied over the substrate. A diffuser section of the cooling aperture is formed in the external coating and the substrate to provide the cooling aperture.

17 Claims, 14 Drawing Sheets

(51) Int. Cl.
*C23C 16/06* (2006.01)
*B23K 26/382* (2014.01)

(56) References Cited

U.S. PATENT DOCUMENTS

| | | |
|---|---|---|
| 6,234,755 B1 | 5/2001 | Bunker |
| 6,368,060 B1 | 4/2002 | Fehrenbach |
| 6,420,677 B1 | 7/2002 | Emer |
| 6,663,919 B2 | 12/2003 | Farmer |
| 6,909,800 B2 | 6/2005 | Vaidyanathan |
| 7,019,257 B2 | 3/2006 | Stevens |
| 7,041,933 B2 | 5/2006 | Forrester |
| 7,328,580 B2 | 2/2008 | Lee |
| 7,820,267 B2 | 10/2010 | Fahndrich |
| 7,964,087 B2 | 6/2011 | Lee |
| 7,997,868 B1 | 8/2011 | Liang |
| 8,057,181 B1 | 11/2011 | Liang |
| 8,157,526 B2 | 4/2012 | Beck |
| 8,168,912 B1 | 5/2012 | Liang |
| 8,245,519 B1 | 8/2012 | Liang |
| 8,672,613 B2 | 3/2014 | Bunker |
| 8,814,500 B1 | 8/2014 | Liang |
| 8,905,713 B2 | 12/2014 | Bunker |
| 9,468,991 B2 | 10/2016 | McDowell |
| 9,518,317 B2 | 12/2016 | Eminoglu |
| 9,598,979 B2 | 3/2017 | Reed |
| 9,650,900 B2 | 5/2017 | Malak |
| 9,696,035 B2 | 7/2017 | Starkweather |
| 9,765,623 B2 | 9/2017 | Kottilingam |
| 9,945,233 B2 | 4/2018 | Tanaka |
| 10,006,293 B1 | 6/2018 | Jones |
| 10,113,433 B2 | 10/2018 | Morris |
| 10,208,602 B2 | 2/2019 | Thornton |
| 10,280,763 B2 | 5/2019 | Torkaman |
| 10,350,684 B2 | 7/2019 | Bunker |
| 10,619,499 B2 | 4/2020 | Kottilingam |
| 10,815,796 B2 | 10/2020 | Burd |
| 2005/0092725 A1 | 5/2005 | Byrd |
| 2005/0173388 A1 | 8/2005 | Lavers |
| 2009/0169394 A1 | 7/2009 | Crow |
| 2009/0248355 A1 | 10/2009 | Kriegmair |
| 2010/0282721 A1 | 11/2010 | Bunker |
| 2012/0102959 A1 | 5/2012 | Starkweather |
| 2012/0167389 A1 | 7/2012 | Lacy |
| 2012/0205355 A1 | 8/2012 | Münzer |
| 2014/0271129 A1 | 9/2014 | Mueller |
| 2015/0354371 A1 | 12/2015 | Sonoo |
| 2016/0356498 A1 | 12/2016 | Gerendas |
| 2017/0089579 A1 | 3/2017 | Bunker |
| 2017/0261208 A1 | 9/2017 | Starkweather |
| 2017/0320163 A1 | 11/2017 | Hu |
| 2017/0335691 A1 | 11/2017 | Crites |
| 2018/0306114 A1 | 10/2018 | Dudebout |
| 2019/0085705 A1 | 3/2019 | Webster |
| 2019/0101004 A1 | 4/2019 | Rudolph |
| 2019/0134752 A1 | 5/2019 | Grafton-Reed |
| 2020/0190990 A1 | 6/2020 | Hohenstein |
| 2020/0217207 A1 | 7/2020 | Loebig |
| 2021/0060709 A1 | 3/2021 | Thayer |

FOREIGN PATENT DOCUMENTS

| | | | | |
|---|---|---|---|---|
| EP | 2918774 A1 | * | 9/2015 | ......... B23K 26/0622 |
| EP | 1967696 B1 | | 3/2017 | |
| EP | 2886798 B1 | | 10/2018 | |
| EP | 3199762 B1 | | 7/2021 | |
| GB | 2389330 B | | 5/2004 | |
| WO | 2020068130 A1 | | 4/2020 | |

* cited by examiner

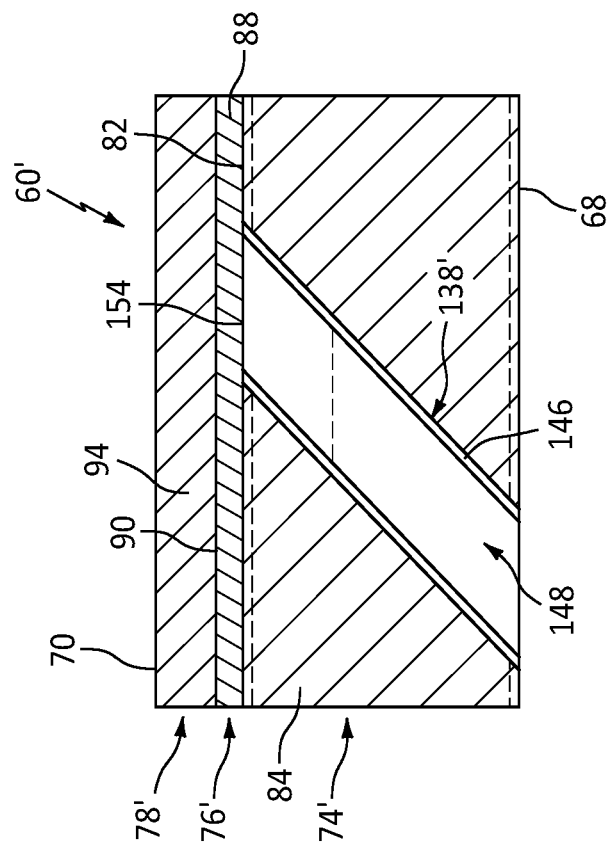
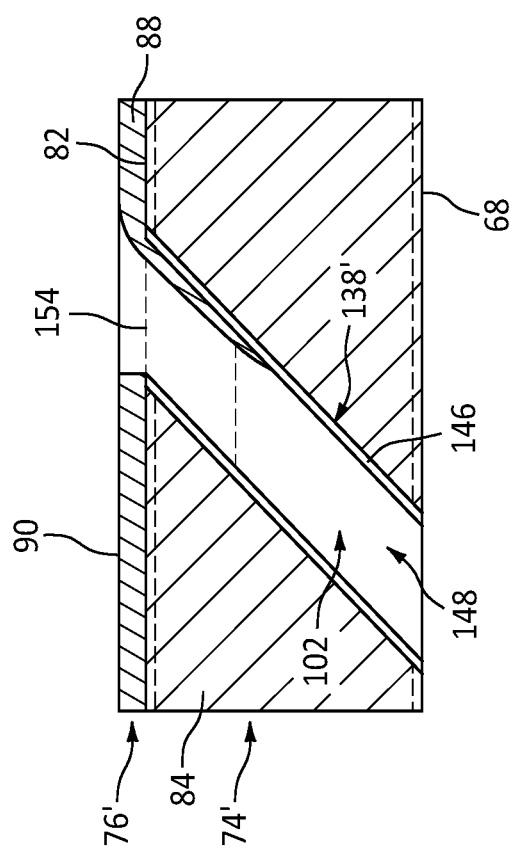

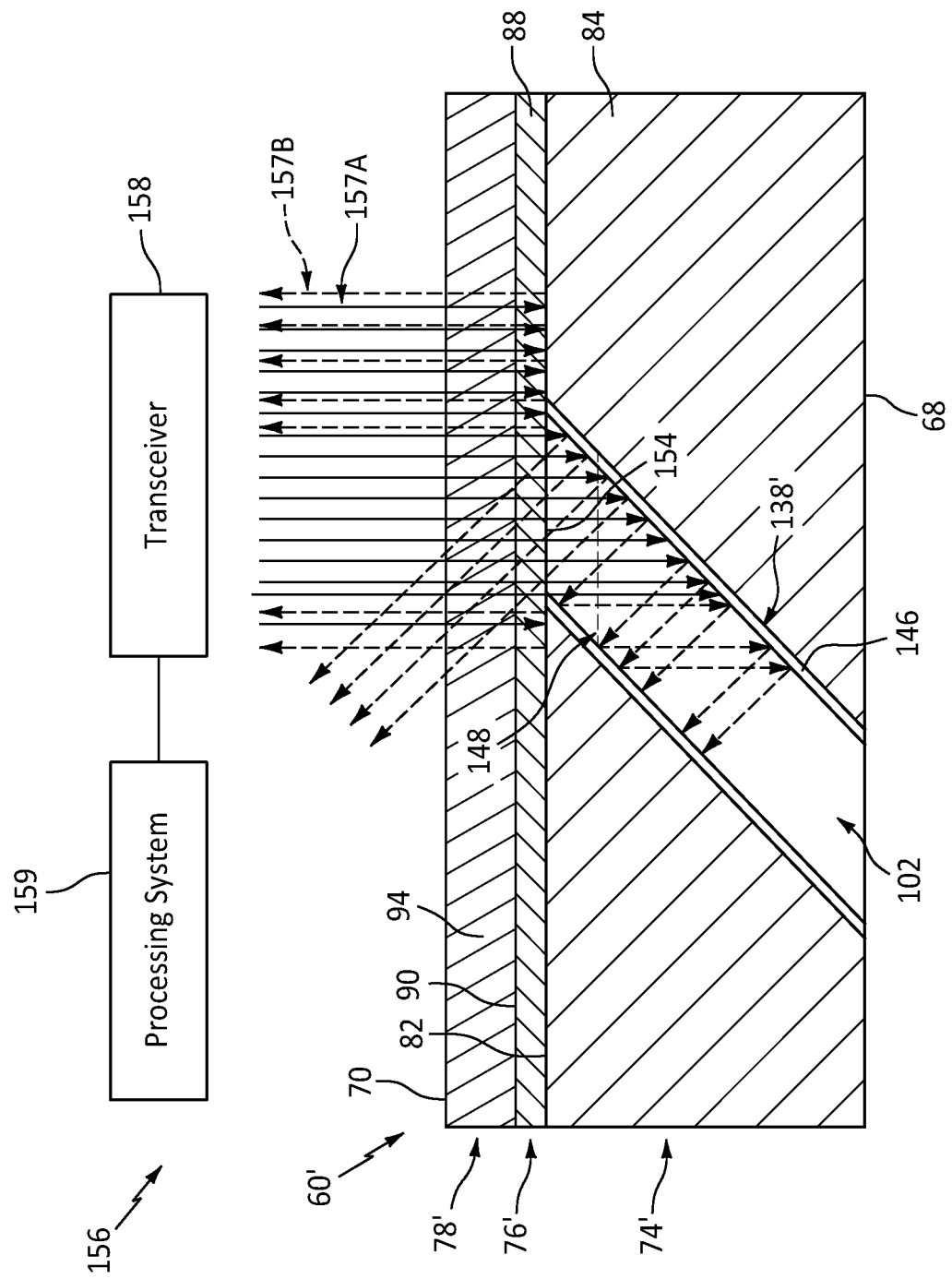

FORMING LINED COOLING APERTURE(S) IN A TURBINE ENGINE COMPONENT

BACKGROUND OF THE DISCLOSURE

1. Technical Field

This disclosure relates generally to a turbine engine and, more particularly, to cooling apertures and formation thereof in a component of the turbine engine.

2. Background Information

A gas turbine engine includes various fluid cooled components such as turbine blades and turbine vanes. Such fluid cooled components may include one or more cooling apertures extending through a sidewall of the respective component. Various methods are known in the art for forming cooling apertures. While these known cooling aperture formation methods have various benefits, there is still room in the art form improvement.

SUMMARY OF THE DISCLOSURE

According to an aspect of the present disclosure, a manufacturing method is provided. During this method, a preform component is provided for a turbine engine. The preform component includes a substrate. A meter section of a cooling aperture is formed in the substrate. An internal coating is applied onto a surface of the meter section. An external coating is applied over the substrate. A diffuser section of the cooling aperture is formed in the external coating and the substrate to provide the cooling aperture.

According to another aspect of the present disclosure, another manufacturing method is provided. During this method, a preform component is provided for a turbine engine. The preform component includes a substrate. A meter section is machined into the substrate. At least a portion of the meter section is lined with an internal coating to provide a lined meter section of a cooling aperture. An external coating is formed over the substrate with the lined meter section. At least a portion of a diffuser section of the cooling aperture is machined into the external coating.

According to still another aspect of the present disclosure, a component is provided for a turbine engine. This component includes a substrate, an external coating, a plurality of cooling apertures and an internal coating. The substrate is configured from or otherwise includes metal. The external coating is over the metal substrate. The external coating is configured from or otherwise includes ceramic. A first of the cooling apertures includes a meter section and a diffuser section. The meter section is formed in the substrate. The diffuser section is formed in the substrate and the external coating. The internal coating at least partially lines the first of the cooling apertures within the substrate. The component is configured as an airfoil or a flowpath wall for the turbine engine.

The substrate may be configured from or otherwise include metal. The internal coating may be configured as or otherwise include an aluminide coating. The external coating may be configured as or otherwise include ceramic.

The internal coating may be configured as or otherwise include an aluminide coating.

The diffuser section may be configured as or otherwise include a multi-lobed diffuser section.

The substrate may be configured from or otherwise include metal. The external coating may be configured from or otherwise include ceramic.

The method may also include applying a bond coating onto the substrate. The external coating may be applied onto the bond coating. The diffuser section may also be formed through the bond coating.

The bond coating may be configured as or otherwise include MCrAlY or MAlCrX. The M may comprise at least one of nickel (Ni), cobalt (Co) or iron (Fe). The Y or the X may comprise at least one of hafnium (Hf), yttrium (Y) or silicon (Si).

The method may also include applying a bond coating onto at least a portion of the internal coating. The external coating may be applied onto the bond coating. The diffuser section may also be formed through the bond coating.

The meter section may be formed using an electrical discharge machining process.

The diffuser section may be formed using a laser machining process.

The preform component may be configured as or otherwise include a preform of an airfoil for the turbine engine.

The preform component may be configured as or otherwise include a preform of a flowpath wall for the turbine engine.

The method may also include modeling the external coating to predict a geometry of the preform component following the application of the external coating. The diffuser section may be formed in the external coating and the substrate based on the predicted geometry.

The modeling may be performed using artificial intelligence.

The modeling may be performed using machine learning.

The method may also include scanning at least a portion of the substrate, the internal coating and the external coating with an imaging system to provide scan data indicative of an internal structure of the portion of the substrate, the internal coating and the external coating. The diffuser section may be formed in the external coating and the substrate based on the scan data.

The imaging system may be configured as or otherwise include a microwave imaging system.

The present disclosure may include any one or more of the individual features disclosed above and/or below alone or in any combination thereof.

The foregoing features and the operation of the invention will become more apparent in light of the following description and the accompanying drawings.

BRIEF DESCRIPTION OF THE DRAWINGS

FIG. 12A-C are sectional illustrations of a portion of the preform substrate configured with various first external coatings.

FIGS. 13A-C are sectional illustrations of a portion of the preform substrate configured with various second external coatings.

FIG. 14 is a sectional illustration of a portion of the preform substrate located proximate an imaging system.

DETAILED DESCRIPTION

The present disclosure includes methods for manufacturing fluid cooled components of a gas turbine engine. For ease of description, the turbine engine may be described below as a turbofan turbine engine. The present disclosure, however, is not limited to such an exemplary gas turbine engine. The turbine engine, for example, may alternatively be configured as a turbojet turbine engine, a turboprop turbine engine, a turboshaft turbine engine, a propfan turbine engine, a pusher fan turbine engine or an auxiliary power unit (APU) turbine engine. The turbine engine may be configured as a geared turbine engine or a direct drive turbine engine. The present disclosure is also not limited to aircraft applications. The turbine engine, for example, may alternatively be configured as a ground-based industrial turbine engine for power generation, or any other type of turbine engine which utilizes fluid cooled components.

Figure 1:
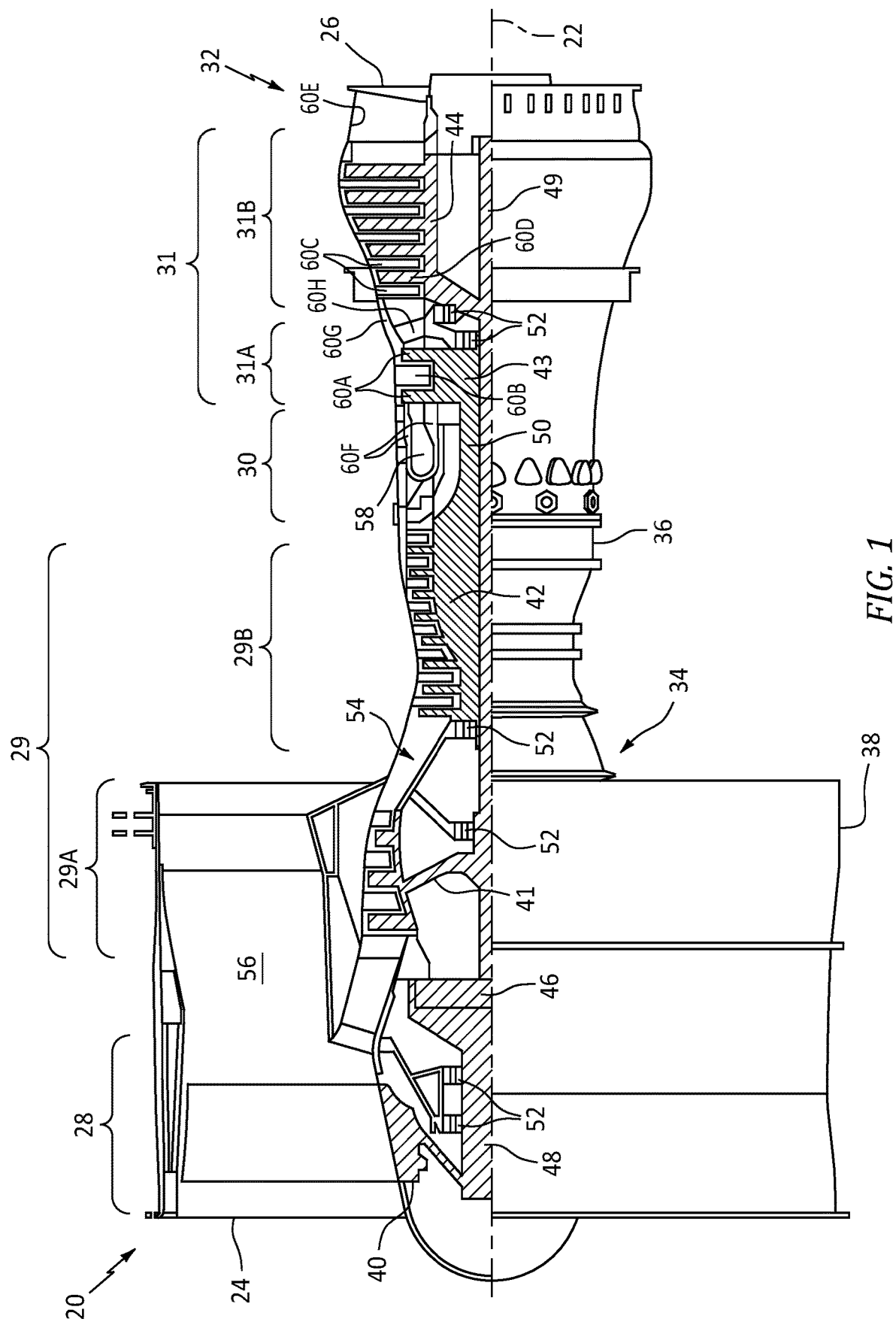
FIG. 1 is a side cutaway illustration of a geared turbofan turbine engine.

FIG. 1 is a side cutaway illustration of the turbofan turbine engine 20. This turbine engine 20 extends along an axial centerline 22 between a forward, upstream airflow inlet 24 and an aft, downstream airflow exhaust 26. The turbine engine 20 includes a fan section 28, a compressor section 29, a combustor section 30, a turbine section 31 and an exhaust section 32 (partially shown in FIG. 1). The compressor section 29 includes a low pressure compressor (LPC) section 29A and a high pressure compressor (HPC) section 29B. The turbine section 31 includes a high pressure turbine (HPT) section 31A and a low pressure turbine (LPT) section 31B.

The engine sections 28-31 are arranged sequentially along the axial centerline 22 within an engine housing 34. This engine housing 34 includes an inner case 36 (e.g., a core case) and an outer case 38 (e.g., a fan case). The inner case 36 may house one or more of the engine sections 29A-31B; e.g., an engine core. The outer case 38 may house at least the fan section 28.

Each of the engine sections 28, 29A, 29B, 31A and 31B includes a respective rotor 40-44. Each of these rotors 40-44 includes a plurality of rotor blades arranged circumferentially around and connected to one or more respective rotor disks. The rotor blades, for example, may be formed integral with or mechanically fastened, welded, brazed, adhered and/or otherwise attached to the respective rotor disk(s).

The fan rotor 40 is connected to a gear train 46, for example, through a fan shaft 48. The gear train 46 and the LPC rotor 41 are connected to and driven by the LPT rotor 44 through a low speed shaft 49. The HPC rotor 42 is connected to and driven by the HPT rotor 43 through a high speed shaft 50. The shafts 48-50 are rotatably supported by a plurality of bearings 52; e.g., rolling element and/or thrust bearings. Each of these bearings 52 is connected to the engine housing 34 by at least one stationary structure such as, for example, an annular support strut.

During operation, air enters the turbine engine 20 through the airflow inlet 24. This air is directed through the fan section 28 and into a core flowpath 54 and a bypass flowpath 56. The core flowpath 54 extends sequentially through the engine sections 29A-32. The air within the core flowpath 54 may be referred to as "core air". The bypass flowpath 56 extends through a bypass duct, which bypasses the engine core. The air within the bypass flowpath 56 may be referred to as "bypass air".

The core air is compressed by the LPC rotor 41 and the HPC rotor 42 and directed into a combustion chamber 58 of a combustor in the combustor section 30. Fuel is injected into the combustion chamber 58 and mixed with the compressed core air to provide a fuel-air mixture. This fuel air mixture is ignited and combustion products thereof flow through and sequentially cause the HPT rotor 43 and the LPT rotor 44 to rotate. The rotation of the HPT rotor 43 and the LPT rotor 44 respectively drive rotation of the HPC rotor 42 and the LPC rotor 41 and, thus, compression of the air received from a core airflow inlet. The rotation of the LPT rotor 44 also drives rotation of the fan rotor 40, which propels bypass air through and out of the bypass flowpath 56. The propulsion of the bypass air may account for a majority of thrust generated by the turbine engine 20, e.g., more than seventy-five percent (75%) of engine thrust. The turbine engine 20 of the present disclosure, however, is not limited to the foregoing exemplary thrust ratio.

The turbine engine 20 includes a plurality of fluid cooled components (e.g., 60A-H; generally referred to as "60") arranged within, for example, the combustor section 30, the turbine section 31 and/or the exhaust section 32. Examples of these fluid cooled components 60 include airfoils such as, but not limited to, a rotor blade airfoil (e.g., 60A, 60D) and a stator vane airfoil (e.g., 60B, 60C, 60H). Other examples of the fluid cooled components 60 include flowpath walls such as, but not limited to, a combustor wall (e.g., 60F), an exhaust duct wall (e.g., 60E), a shroud or other flowpath wall (e.g., 60G), a rotor blade platform and a stator vane platform. Of course, various other fluid cooled components may be included in the turbine engine 20, and the present disclosure is not limited to any particular types or configurations thereof.

Figure 2:
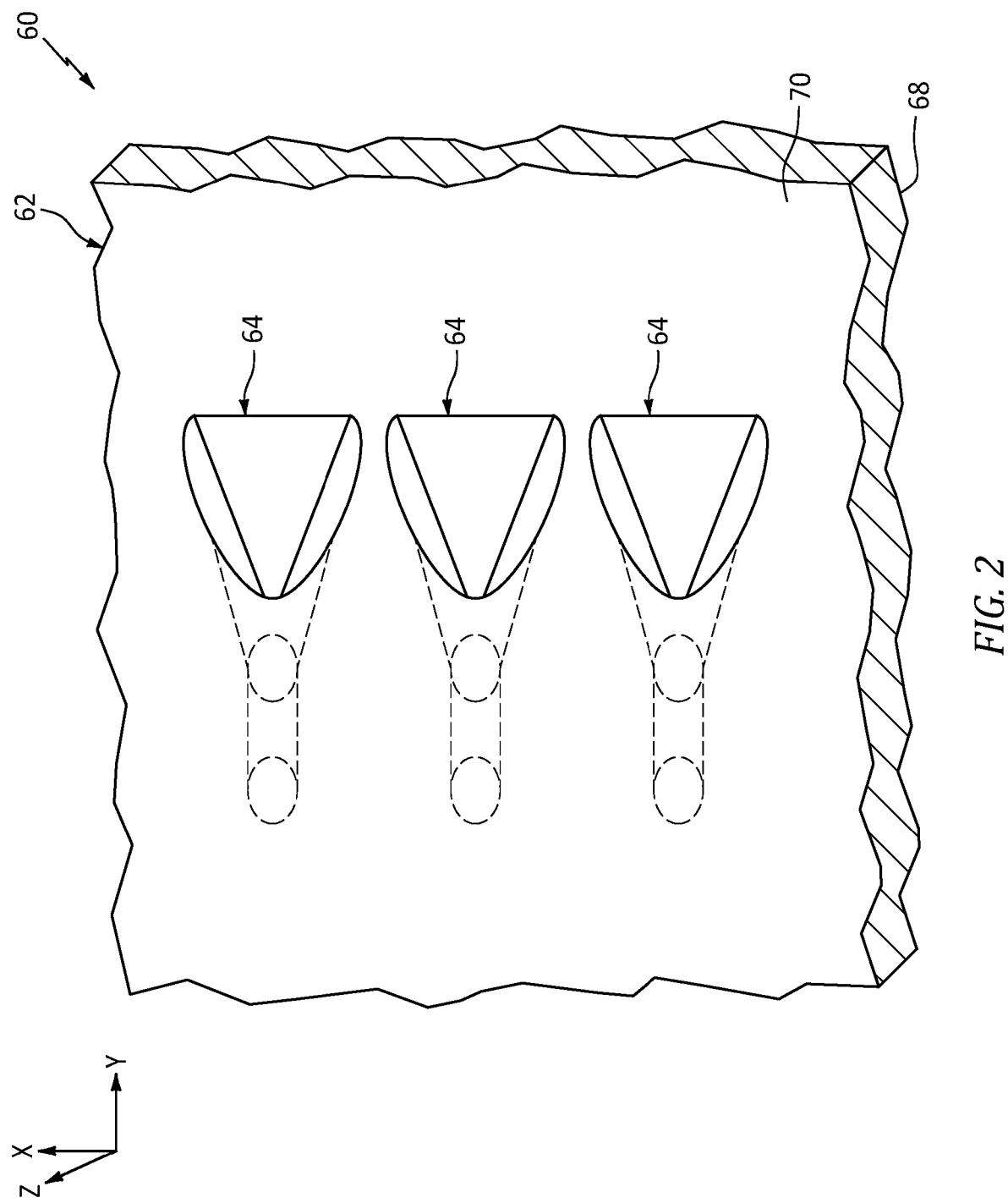
FIG. 2 is a perspective illustration of a portion of a fluid cooled component.

FIG. 2 illustrates a portion of one of the fluid cooled components 60 within the turbine engine 20. This fluid cooled component 60 has a component wall 62 (e.g., a sidewall or an endwall) configured with one or more cooling apertures 64.

Figure 3:
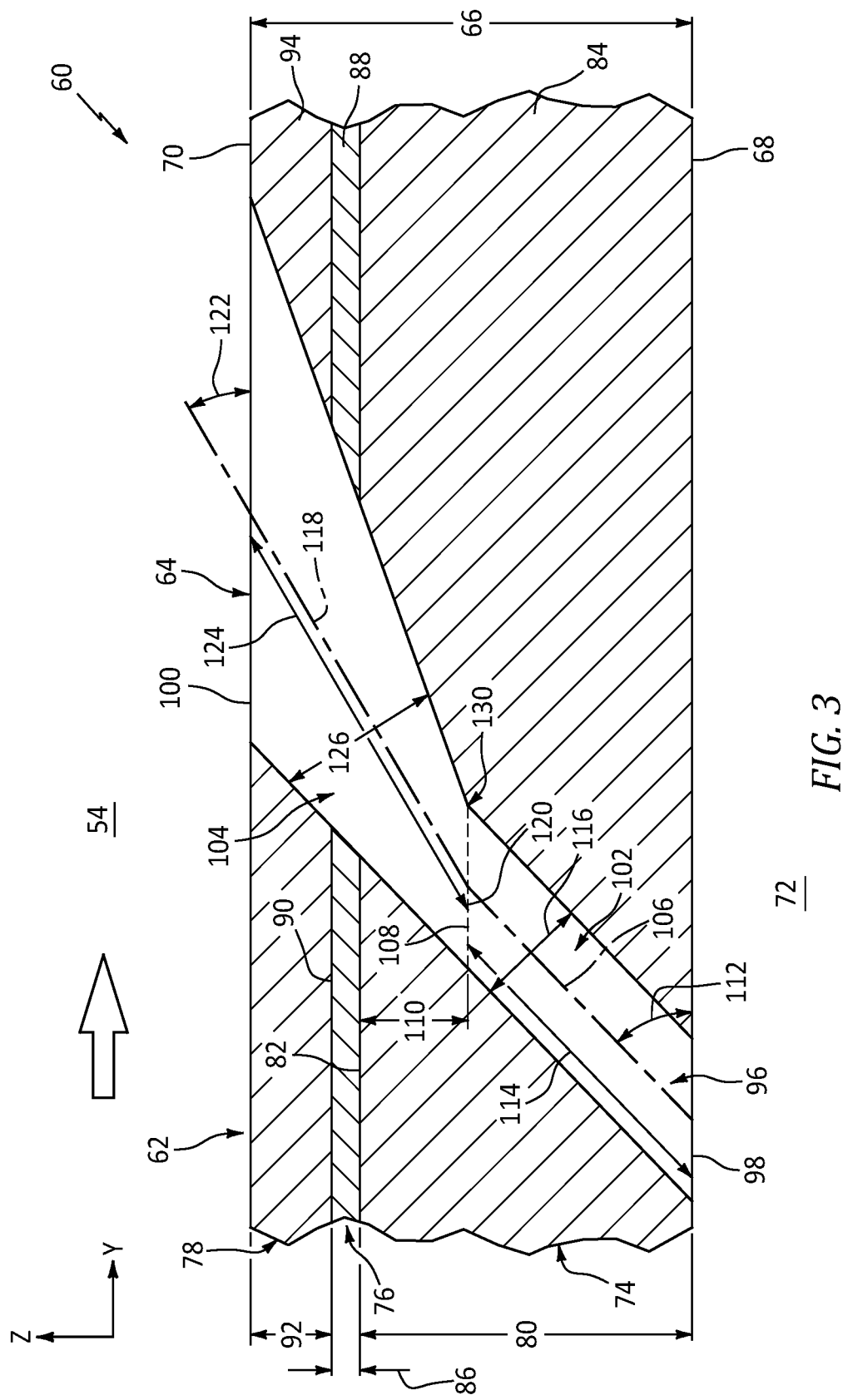
FIG. 3 is a sectional illustration of a portion of the fluid cooled component taken along a centerline of a cooling aperture.

Referring to FIG. 3, the component wall 62 has a thickness 66 that extends vertically (e.g., along a z-axis) between and to a first surface 68 and a second surface 70. The component first surface 68 may be configured as an interior and/or a cold side surface of the component wall 62. The component first surface 68, for example, may at least partially form a peripheral boundary of a cooling fluid volume 72 (e.g., a cavity or a passage) along the component wall 62. The component first surface 68 may thereby be subject to relatively cool fluid (e.g., cooling air) supplied to the cooling fluid volume 72. This cooling fluid volume 72 may be an internal volume formed within the fluid cooled component 60 where, for example, the component is an airfoil. Alternatively, the cooling fluid volume 72 may be an external volume formed external to the fluid cooled component 60 where, for example, the component is a flowpath wall. The component second surface 70 may be configured as an exterior and/or a hot side surface of the component wall 62. The component second surface 70, for example, may at least partially form a peripheral boundary of a portion of, for example, the core flowpath 54 along the component wall 62. The component second surface 70 may thereby be subject to relative hot fluid (e.g., combustion products) flowing through the core flowpath 54 within, for example, one of the engine sections 30-32 of FIG. 1.

The component wall 62 of FIG. 3 includes a component substrate 74 and one or more external component coatings 76 and 78. The component substrate 74 at least partially or completely forms and carries the component first surface 68. The component substrate 74 has a thickness 80 that extends vertically (e.g., along the z-axis) between and to the component first surface 68 and a second surface 82 of the component substrate 74. This substrate second surface 82 may be configured as an exterior surface of the component substrate 74 prior to being (e.g., partially or completely) covered by the one or more component coatings 76 and 78. The substrate thickness 80 may be greater than one-half (½) of the wall thickness 66. The substrate thickness 80, for example, may be between two-third (⅔) and four-fifths (⅘) of the wall thickness 66.

The component substrate 74 is constructed from substrate material 84. This substrate material 84 may be an electrically conductive material. The substrate material 84, for example, may be or otherwise include metal. Examples of the metal include, but are not limited to, nickel (Ni), titanium (Ti), aluminum (Al), chromium (Cr), cobalt (Co), and alloys thereof. The metal, for example, may be a nickel or cobalt based superalloy such as, but not limited to, PWA 1484 or PWA 1429.

The inner coating 76 may be configured as a bond coating between the component substrate 74 and the outer coating 78. The inner coating 76 of FIG. 3 is bonded (e.g., directly) to the substrate second surface 82. The inner coating 76 at least partially or completely covers the substrate second surface 82 (e.g., along an x-y plane of FIG. 2). The inner coating 76 has a thickness 86 that extends vertically (e.g., along the z-axis) between and to component substrate 74 and the outer coating 78. This inner coating thickness 86 may be less than one-seventh (1/7) of the wall thickness 66. The inner coating thickness 86, for example, may be between one-eighth (⅛) and one-fortieth (1/40) of the wall thickness 66.

The inner coating 76 is constructed from inner coating material 88. This inner coating material 88 may be an electrically conductive material. The inner coating material 88, for example, may be or otherwise include metal. Examples of the metal include, but are not limited to, MCrAlY and MAlCrX, where "M" is nickel (Ni), cobalt (Co), iron (Fe) or any combination thereof, and where "Y" or "X" is hafnium (Hf), yttrium (Y), silicon (Si) or any combination thereof. The MCrAlY and MAlCrX may be further modified with strengthening elements such as, but not limited to, tantalum (Ta), rhenium (Re), tungsten (W), molybdenum (Mo) or any combination thereof. An example of the MCrAlY is PWA 286.

The inner coating 76 may be formed from a single layer of the inner coating material 88. The inner coating 76 may alternatively be formed from a plurality of layers of the inner coating material 88, where the inner coating material 88 within each of those inner coating layers may be the same as one another or different from one another.

The outer coating 78 may be configured as a protective coating for the component substrate 74 and, more generally, the fluid cooled component 60. The outer coating 78, for example, may be configured as a thermal barrier layer and/or an environmental layer. The outer coating 78 at least partially or completely forms and carries the component second surface 70. The outer coating 78 of FIG. 2 is bonded (e.g., directly) to a second (e.g., exterior) surface 90 of the inner coating 76. The outer coating 78 at least partially or completely covers the inner coating second surface 90 as well as the underlying substrate second surface 82 (e.g., along an x-y plane of FIG. 2). The outer coating 78 has a thickness 92 that extends vertically (e.g., along the z-axis) between and to the inner coating 76 and the component second surface 70. This outer coating thickness 92 may be less than one-half (½) of the wall thickness 66. The outer coating thickness 92, for example, may be between one-third (⅓) and one-eighth (⅛) of the wall thickness 66. The outer coating thickness 92, however, may be greater than the inner coating thickness 86.

The outer coating 78 is constructed from outer coating material 94. This outer coating material 94 may be a non-electrically conductive material. The outer coating material 88, for example, may be or otherwise include ceramic. Examples of the ceramic include, but are not limited to, yttria stabilized zirconia (YSZ) and gadolinium zirconate (GdZ). The outer coating material 94 of the present disclosure is not limited to non-electrically conductive materials. In other embodiments, for example, the outer coating material 94 may be an electrically conductive material; e.g., metal.

The outer coating 78 may be formed from a single layer of the outer coating material 94. The outer coating 78 may alternatively be formed from a plurality of layers of the outer coating material 94, where the outer coating material 94 within each of those outer coating layers may be the same as one another or different from one another. For example, the outer coating 78 may include a thin interior layer of the YSZ and a thicker exterior later of the GdZ.

Each of the cooling apertures 64 extends along a respective longitudinal centerline 96 between and to an inlet 98 of the respective cooling aperture 64 and an outlet 100 of the respective cooling aperture 64. The cooling aperture inlet 98 of FIG. 3 is located in the component first surface 68. The cooling aperture inlet 98 thereby fluidly couples its respective cooling aperture 64 with the cooling fluid volume 72 along the component first surface 68. The cooling aperture outlet 100 of FIG. 3 is located in the component second surface 70. The cooling aperture outlet 100 thereby fluidly couples its respective cooling aperture 64 with the core flowpath 54 along the component second surface 70.

Each of the cooling apertures 64 may include a meter section 102 and a diffuser section 104. The meter section 102 is disposed at (e.g., on, adjacent or proximate) the cooling aperture inlet 98. The meter section 102 is configured to meter (e.g., regulate) a flow of cooling fluid flowing from the cooling fluid volume 72, through the substrate material 84, to the diffuser section 104. The diffuser section 104 is disposed at the cooling aperture outlet 100. The diffuser section 104 is configured to diffuse the cooling fluid exhausted (e.g., directed out) from the cooling aperture outlet 100 into, for example, a film for cooling a downstream portion of the component second surface 70.

The meter section 102 of FIG. 3 extends longitudinally along the longitudinal centerline 96 within (e.g., partially into) the component substrate 74. More particularly, the meter section 102 extends longitudinally along a meter segment 106 of the longitudinal centerline 96 (e.g., a centerline of the meter section 102) from the cooling aperture inlet 98 to an outlet 108 of the meter section 102. The meter section outlet 108 of FIG. 3 is disposed vertically within the component substrate 74 intermediately between the component first surface 68 and the substrate second surface 82. The meter section outlet 108 of FIG. 3 is thereby vertically recessed into the component substrate 74 by a vertical distance 110 (e.g., along the z-axis).

The longitudinal centerline 96 and its (e.g., entire) meter segment 106 of FIG. 3 are angularly offset from the component first surface 68 by an included angle 112. This meter segment angle 112 may be an acute angle. The meter segment angle 112, for example, may be between ten degrees (10°) and eighty degrees (80°); e.g., between twenty degrees (20°) and thirty degrees (30°).

The meter section 102 has a longitudinal length 114 measured along the meter segment 106 between the cooling aperture inlet 98 and the meter section outlet 108. The meter section 102 has a lateral width 116 (e.g., diameter) measured along a line perpendicular to the meter section 102 of the longitudinal centerline 96. The meter section lateral width 116 may be different (e.g., smaller or larger) than or equal to the meter section longitudinal length 114.

Figure 4:
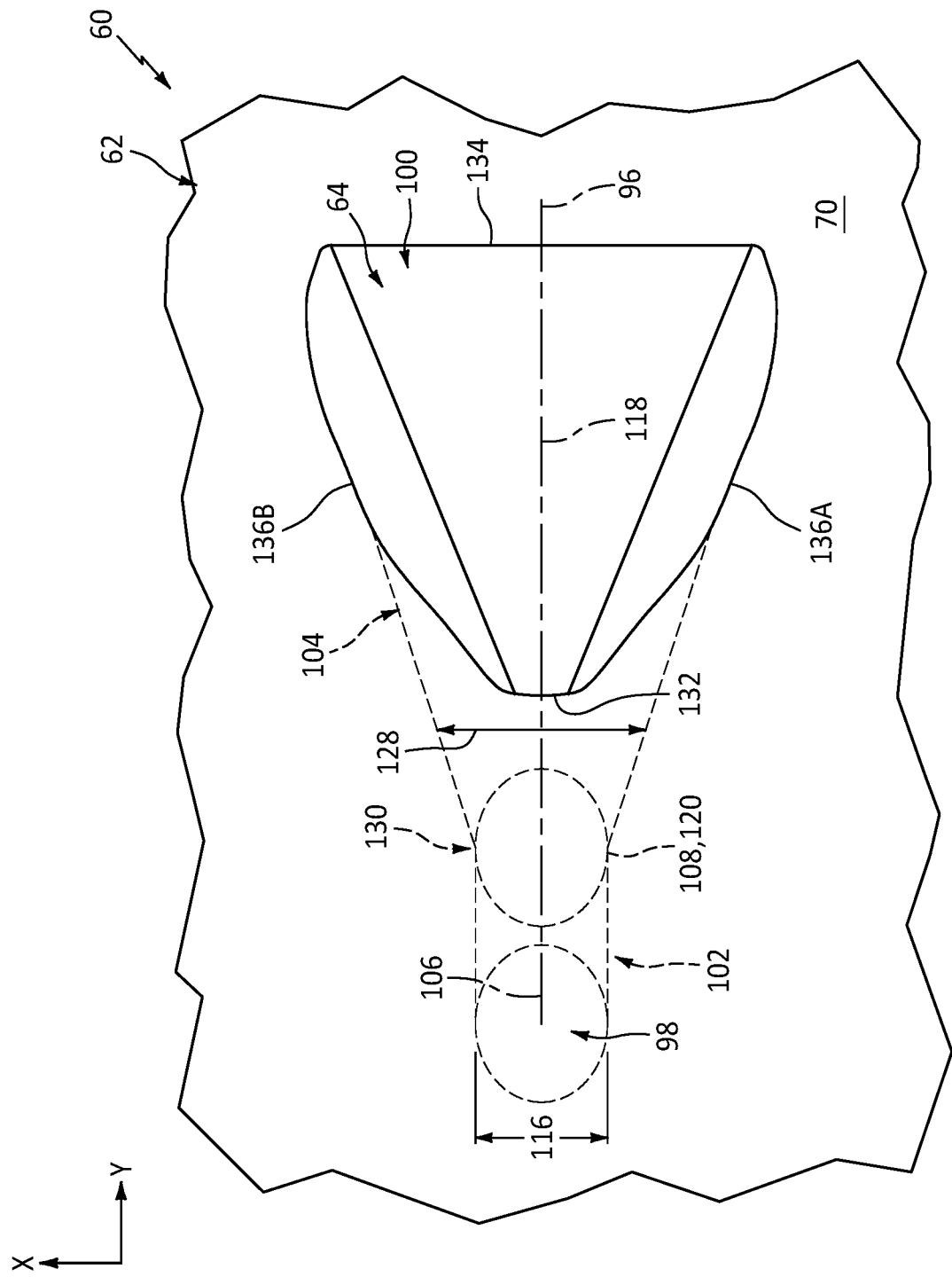
FIG. 4 is a side illustration of a portion of the fluid cooled component and the cooling aperture.

The meter section 102 has a cross-sectional geometry when viewed, for example, in a plane perpendicular to its meter segment 106 (or the x-y plane). This meter section cross-sectional geometry may be uniform along the longitudinal length 114 of the meter section 102. Referring to FIG. 4, the meter section cross-sectional geometry may be circular, oval, elliptical or otherwise annular in shape. The present disclosure, however, is not limited to such exemplary annular shapes.

The diffuser section 104 of FIG. 3 extends longitudinally along the longitudinal centerline 96 out of the component substrate 74, through the inner coating 76 and the outer coating 78. More particularly, the diffuser section 104 of FIG. 3 extends longitudinally along a diffuser segment 118 of the longitudinal centerline 96 (e.g., a centerline of the diffuser section 104) from an inlet 120 of the diffuser section 104 (here, the same as the meter section outlet 108), through the materials 84, 88 and 94, to the cooling aperture outlet 100. The diffuser section inlet 120 of FIG. 3 is disposed vertically within the component substrate 74 intermediately between the component first surface 68 and the substrate second surface 82. The diffuser section inlet 120 of FIG. 3 is thereby vertically recessed into the component substrate 74 by the vertical distance 110 (e.g., along the z-axis).

The longitudinal centerline 96 and its (e.g., entire) diffuser segment 118 of FIG. 3 are angularly offset from the component second surface 70 by an included angle 122. This diffuser segment angle 122 may be an acute angle. The diffuser segment angle 122, for example, may be between twenty degrees (20°) and eighty degrees (80°); e.g., between thirty-five degrees (35°) and fifty-five degrees (55°). The diffuser segment angle 122 of FIG. 3 is different (e.g., less) than the meter segment angle 112. The diffuser segment 118 may thereby be angularly offset from the meter segment 106.

The diffuser section 104 has a longitudinal length 124 measured along the diffuser segment 118 between the diffuser section inlet 120 and the cooling aperture outlet 100. This diffuser section longitudinal length 124 may be equal to or different (e.g., less or greater) than the meter section longitudinal length 114. The diffuser section 104 has a lateral width 126, 128 (see FIG. 4) measured along a respective line perpendicular to the diffuser segment 118 of the longitudinal centerline 96. The diffuser section lateral width 126, 128 may be different (e.g., smaller or larger) than or equal to the diffuser section longitudinal length 124. The diffuser section lateral width 126, 128 of FIGS. 3 and 4 at the interface 130 between the diffuser section 104 and the meter section 102 is equal to the meter section lateral width 116. However, the diffuser section lateral width 126, 128 of FIGS. 3 and 4 at other locations along the longitudinal centerline 96 may be greater than meter section lateral width 116. More particularly, the diffuser section 104 laterally diverges as the diffuser section 104 projects longitudinally away from the meter section 102 towards or to the cooling aperture outlet 100.

The diffuser section 104 has a cross-sectional geometry when viewed, for example, in a plane perpendicular to its diffuser segment 118. This diffuser section cross-sectional geometry changes as the diffuser section 104 projects longitudinally away from the meter section 102, sequentially through the materials 84, 88 and 94 of FIG. 3, to the cooling aperture outlet 100.

Referring to FIG. 4, the cooling aperture outlet 100 may have a complex cross-sectional geometry when viewed, for example, a plane parallel with the component second surface 70 (e.g., the x-y plane). This outlet cross-sectional geometry may include a (e.g., curved or straight) leading edge section 132, a (e.g., curved or straight) trailing edge section 134 and opposing (e.g., curved or straight) sidewall sections 136A and 136B (generally referred to as "136"). Each of the sidewall sections 136 extends between and to respective ends of the leading and the trailing edge sections 132 and 134. A lateral width of the leading edge section 132 may be different (e.g., smaller) than a lateral width of the trailing edge section 134. The sidewall sections 136 may thereby generally laterally diverge away from one another as the sidewall sections 136 extend from the leading edge section 132 to the trailing edge section 134.

Figure 6:
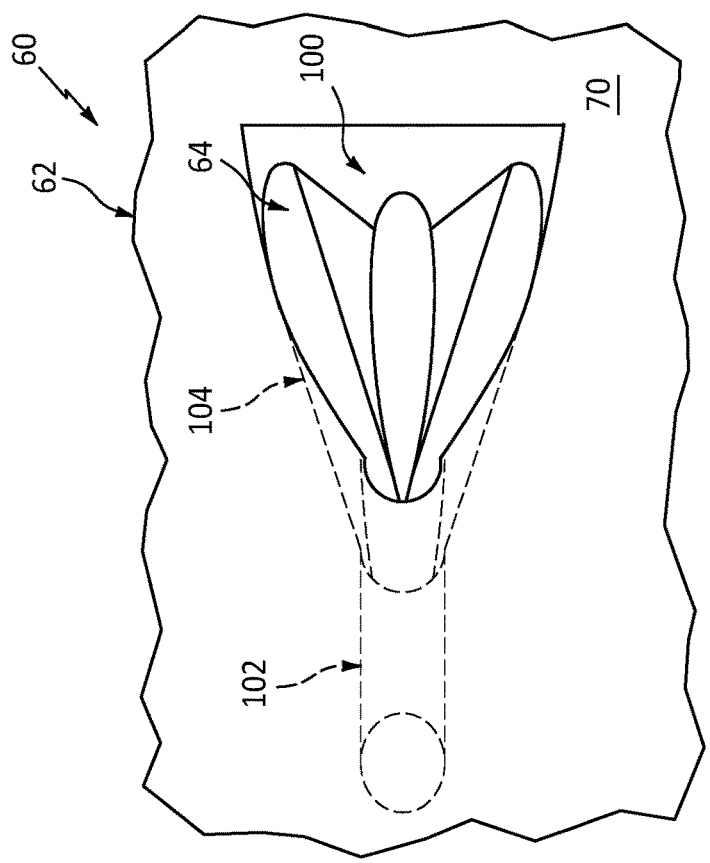
FIGS. 5 and 6 are side illustrations of portions of the fluid cooled component configured with various multi-lobed cooling apertures.
Figure 5:
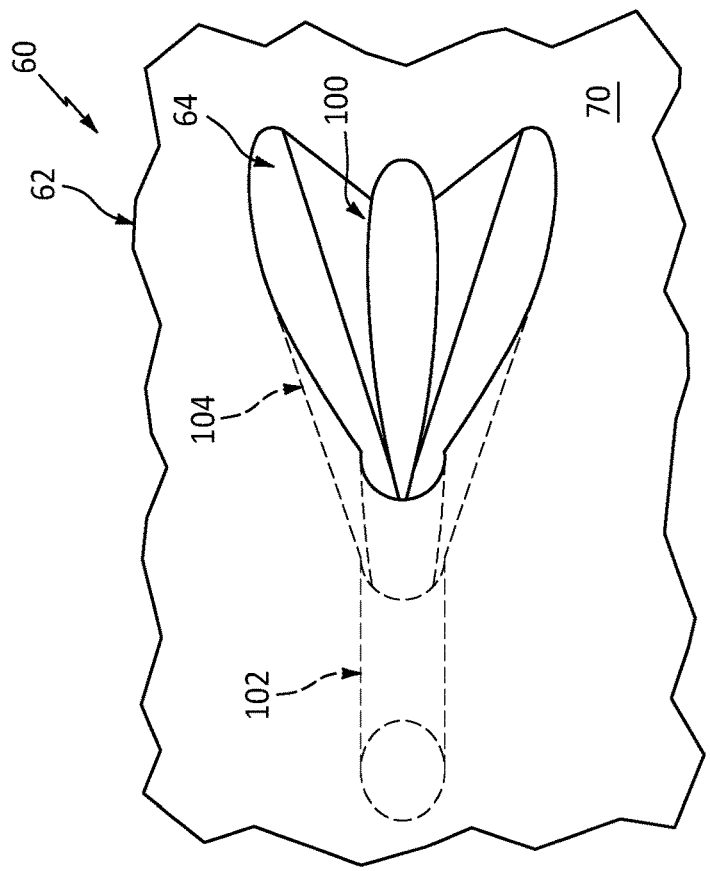

In some embodiments, referring to FIG. 4, the diffuser section 104 may be configured as a single lobe diffuser section. In other embodiments, referring to FIGS. 5 and 6, the diffuser section 104 may be configured as a multi-lobe diffuser section. Various other single lobe and multi-lobe diffuser sections for cooling apertures 64 are known in the art, and the present disclosure is not limited to any particular ones thereof. Further details on various multi-lobe diffuser sections can be found in U.S. Pat. No. 9,598,979, which is assigned to the assignee of the present disclosure and hereby incorporated herein by reference in its entirety.

Figure 7:
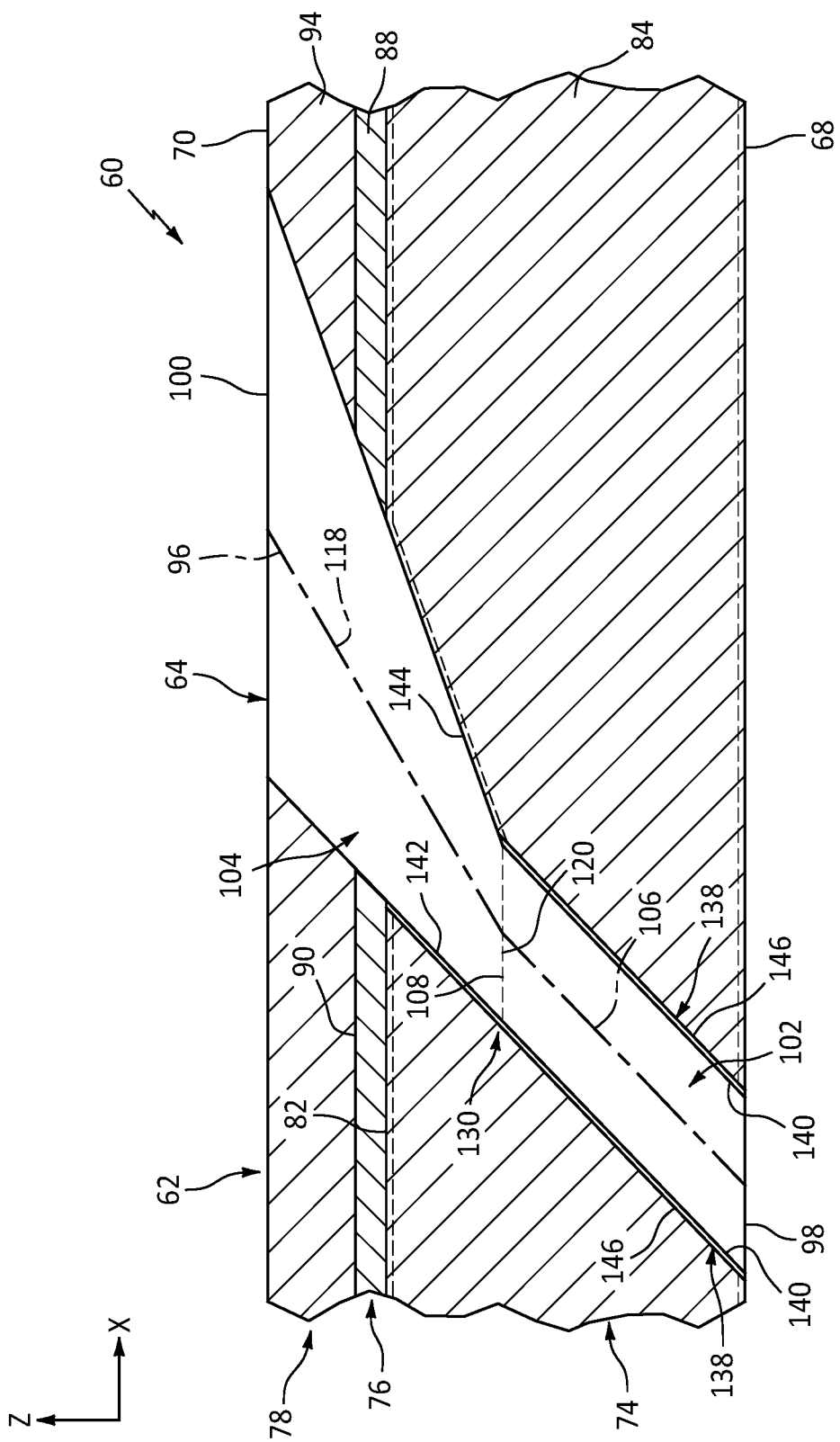
FIG. 7 is a sectional illustration of a portion of the fluid cooled component taken along the centerline of the cooling aperture, where the fluid cooling component is further configured with an internal coating.

In some embodiments, referring to FIG. 7, the component wall 62 may also include at least one internal coating 138. This internal coating 138 may be configured as a protective coating (e.g., oxidation resistant coating) for at least some or all of the substrate material 84 forming the respective cooling aperture 64 within the substrate material 84.

The internal coating 138 may line at least a portion or all of the meter section 102. The internal coating 138 of FIG. 7, for example, forms a (e.g., tubular, cylindrical) surface 140, which surface 140 forms a peripheral side of the meter section 102. The internal coating 138 may also line a portion or all of the diffuser section 104 formed within the substrate material 84. The internal coating 138 of FIG. 7, for example, also forms a surface segment 142 (or segments) forming a side of the diffuser section 104 within the aperture material 84; e.g., an upstream side segment of the diffuser section 104. Depending on specific cooling aperture formation techniques (discussed below in further detail), the internal coating 138 may also form another surface segment 144 (or segments) forming another side of the diffuser section 104 within the aperture material 84; e.g., a downstream side surface segment of the diffuser section 104. The internal coating 138 may also form on some or all of the first surface 68 and/or the second surface 70.

The internal coating 138 is constructed from internal coating material 146. This internal coating material 146 may be an electrically conductive material. The internal coating material 146, for example, may be or otherwise include metal. The internal coating 138, for example, may be an aluminide coating, a chromide coating, a platinum-aluminum (PtAl) coating or a nickel-cobalt-chromium-aluminum-yttrium (NiCoCrAlY) coating.

Figure 8:
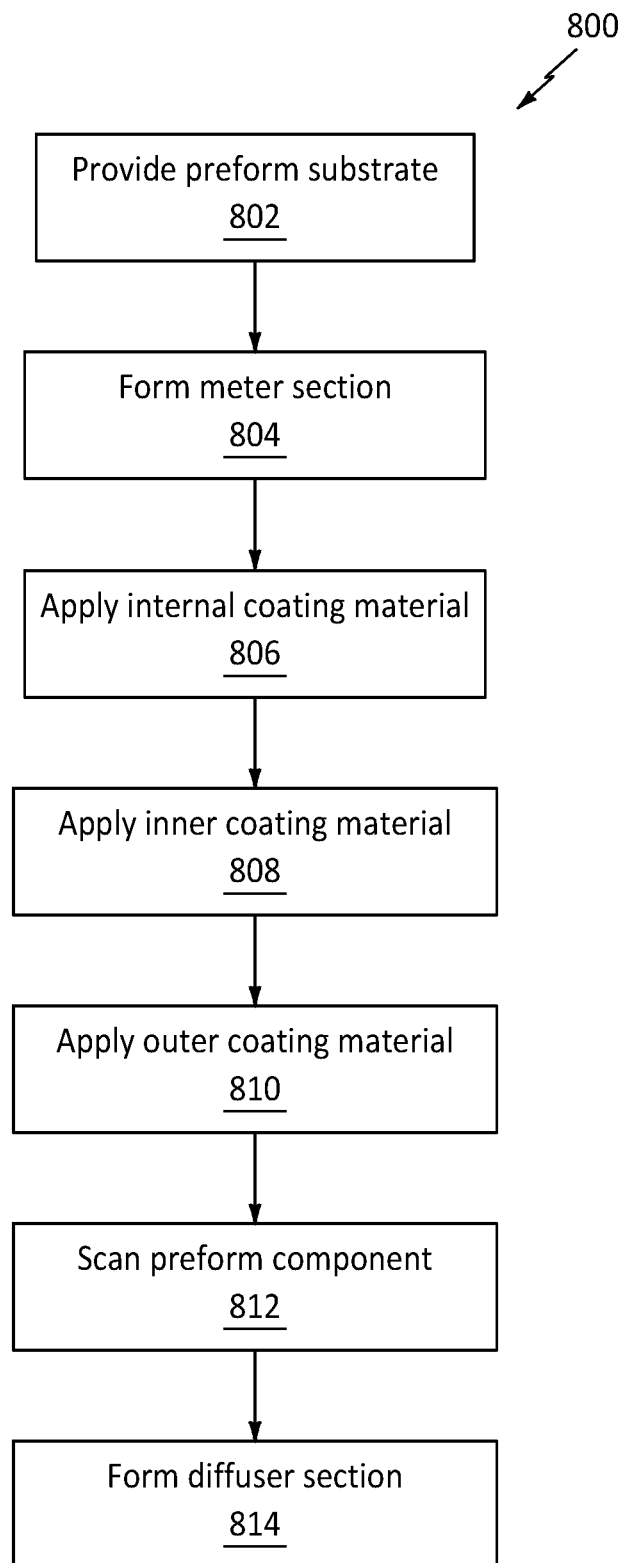
FIG. 8 is a flow diagram of a method for manufacturing a fluid cooled component.

FIG. 8 is a flow diagram of a method 800 for manufacturing a fluid cooled component. For ease of description, the method 800 is described below with reference to the fluid cooled component 60 described above. The method 800 of the present disclosure, however, is not limited to manufacturing such an exemplary fluid cooled component.

Figure 9:
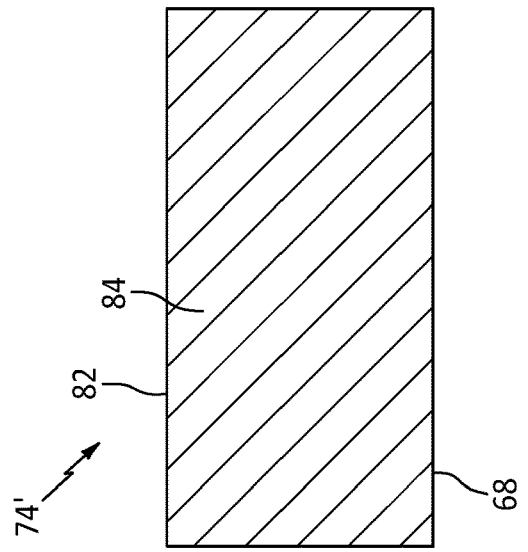
FIG. 9 is a sectional illustration of a portion of a preform substrate.

In step 802, a preform substrate 74' is provided. Referring to FIG. 9, the preform substrate 74' may generally have the configuration (e.g., shape, size, etc.) of the substrate for the fluid cooled component 60 to be formed (e.g., see FIGS. 3 and 7). The preform substrate 74' of FIG. 9, however, does not include any holes therein for forming the cooling apertures 64.

Figure 10:
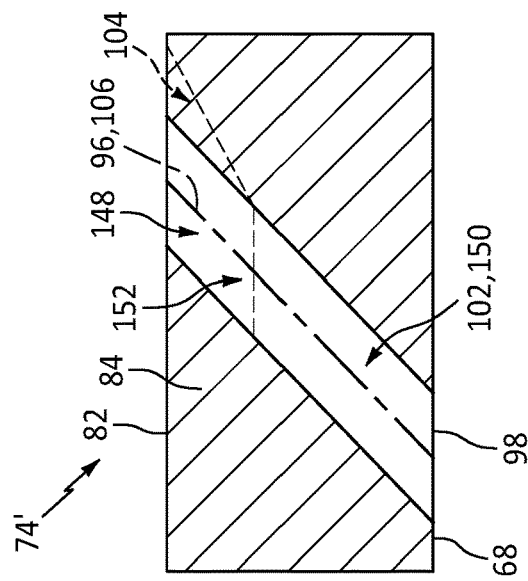
FIG. 10 is a sectional illustration of a portion of the preform substrate configured with a preform aperture.

In step 804, the meter section 102 of a respective cooling aperture 64 is formed in the preform substrate 74'. For example, referring to FIG. 10, a portion of the substrate material 84 is machined away (from the exterior of the preform substrate 74') to form, for example, a preform aperture 148. This preform aperture 148 of FIG. 10 extends along the meter segment 106 of the longitudinal centerline 96 (e.g., completely) through the substrate material 84 between and to the second surface 82 of the preform substrate 74' and the first surface 68 of the preform substrate 74'. A first portion 150 of the preform aperture 148 of FIG. 10 (e.g., partially or completely) forms the meter section 102. A second portion 152 of the preform aperture 148 of FIG. 10 forms a portion of the later-to-be-formed diffuser section 104.

The preform aperture 148 and the meter section 102 may be formed in the (e.g., electrically conductive, metal) substrate material 84 using a preform aperture/meter section machining process. This preform aperture/meter section machining process may be selected to quickly, precisely and efficiently form the preform aperture 148 and the meter section 102 in the electrically conductive, metal substrate material 84. The preform aperture/meter section machining process, for example, may be an electrical discharge machining (EDM) process. The present disclosure, however, is not limited to such an exemplary preform aperture/meter section machining process. The preform aperture 148 and the meter section 102, for example, may also or alternatively be formed using one or more other machining processes such as, but not limited to, a laser machining (e.g., ablation) process, a water-jet guided laser (WJGL) machining process, an abrasive water jet (AWJ) machining process, an electron beam machining process, and a mechanical drilling process.

Figure 11:
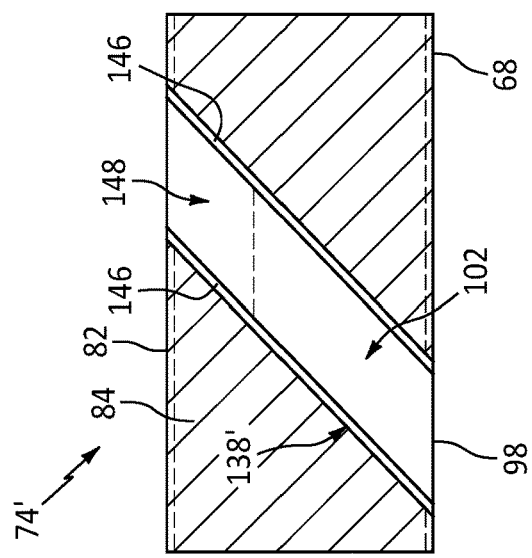
FIG. 11 is sectional illustration of a portion of the preform substrate configured with a preform internal coating lining the preform aperture.

In step 806, a preform internal coating 138' is applied to the preform substrate 74'. For example, referring to FIG. 11, the internal coating material 146 may be applied (e.g., deposited) onto a surface forming the preform aperture 148 thereby providing a lined preform aperture/a lined meter section. The internal coating material 146 may also be applied (e.g., deposited) onto at least a portion (or an entirety) of the second surface 82 of the preform substrate 74' and/or onto at least a portion (or an entirety) of the first surface 68 of the preform substrate 74'. The internal coating material 146 may be applied using various internal coating application techniques. Examples of the internal coating application techniques include, but are not limited to, a physical vapor deposition (PVD) process and chemical vapor deposition (CVD) process. The preform internal coating 138' of FIG. 11 may generally have the configuration of the internal coating 138 for the fluid cooled component to be formed (e.g., see FIG. 7).

Figure 12A:
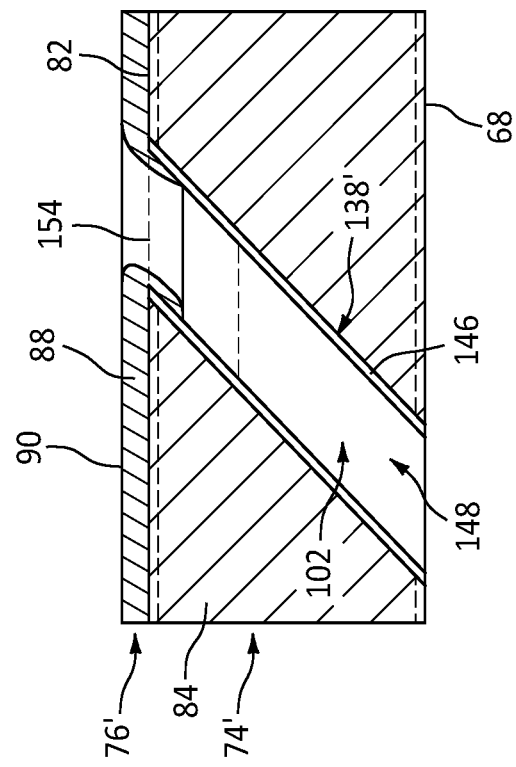

In step 808, a preform inner coating 76' is applied over the preform substrate 74'. For example, referring to FIG. 12A, the inner coating material 88 may be applied (e.g., deposited) onto the second surface 82 of the preform substrate 74'. The inner coating material 88 may be applied using various inner coating application techniques. Examples of the inner coating application techniques include, but are not limited to, a physical vapor deposition (PVD) process, chemical vapor deposition (CVD) process, a plating process, and a thermal spray process (e.g., a plasma spray (PS) process, a high velocity oxygen fuel (HVOF) process, high velocity air fuel (HVAF) process, a wire spray process or a combustion spray process). The inner coating application may be performed via a non-line-of-sight (NLOS) coating process or a direct-line-of-sight (DLOS) coating process. The preform inner coating 76' of FIG. 12A may generally have the configuration of the inner coating 76 for the fluid cooled component 60 to be formed (e.g., see FIGS. 3 and 7).

Figure 12B:
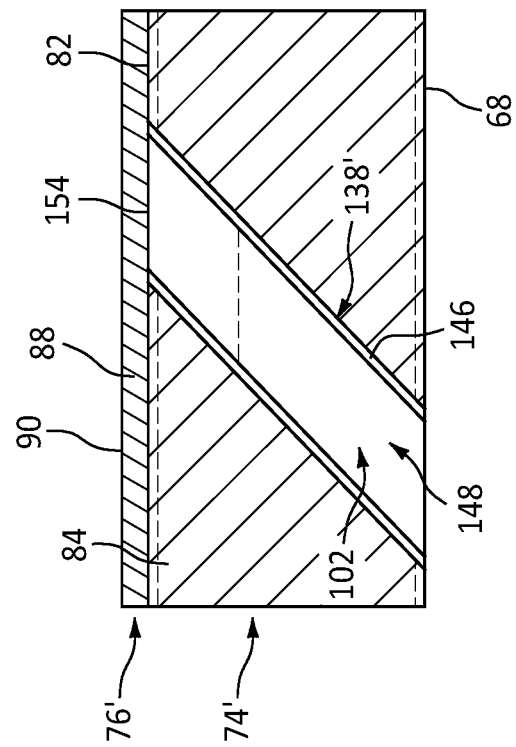

Depending upon the inner coating material 88, the inner coating thickness 86 (see FIG. 3) and/or the inner coating application technique, the inner coating material 88 may at least partially or completely cover or otherwise cap/plug an end 154 of the preform aperture 148. Alternatively, at least a portion or an entirety of the preform aperture end 154 may remain open (e.g., uncovered, unplugged) as shown, for example, in FIGS. 12B and 12C.

Figure 13C:
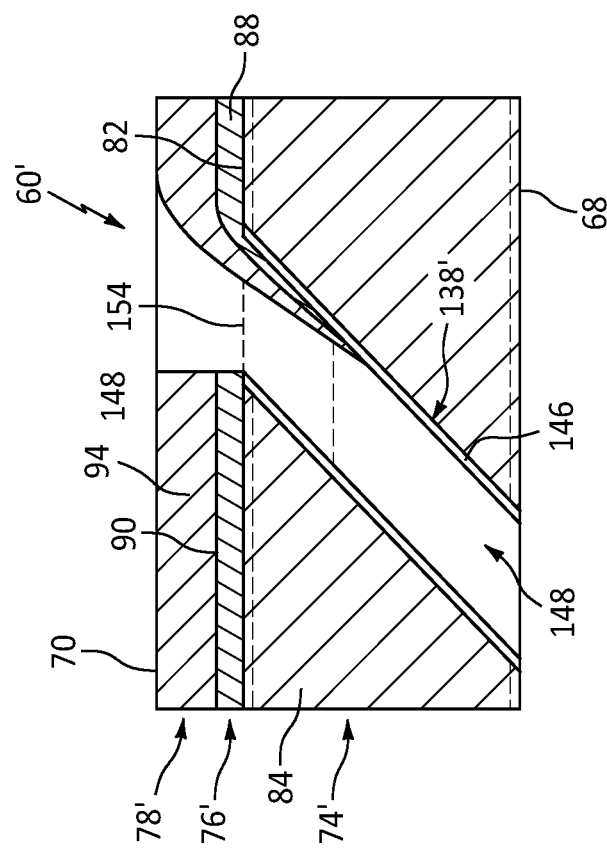

In step 810, a preform outer coating 78' is applied over the preform substrate 74' and the preform inner coating 76'. For example, referring to FIG. 13A, the outer coating material 94 may be applied (e.g., deposited) onto the second surface 90 of the preform inner coating 76'. The outer coating material 94 may be applied using various outer coating application techniques. Examples of the outer coating application techniques include, but are not limited to, a physical vapor deposition (PVD) process (e.g., an electron-beam PVD process), chemical vapor deposition (CVD) process, a thermal spray process (e.g., a plasma spray (PS) process, a high velocity oxygen fuel (HVOF) process, high velocity air fuel (HVAF) process, a wire spray process or a combustion spray process). The outer coating application may be performed via a non-line-of-sight (NLOS) coating process or a direct-line-of-sight (DLOS) coating process. The preform outer coating 78' of FIG. 13A may generally have the configuration of the outer coating 78 for the fluid cooled component 60 to be formed (e.g., see FIGS. 3 and 7).

Figure 13B:
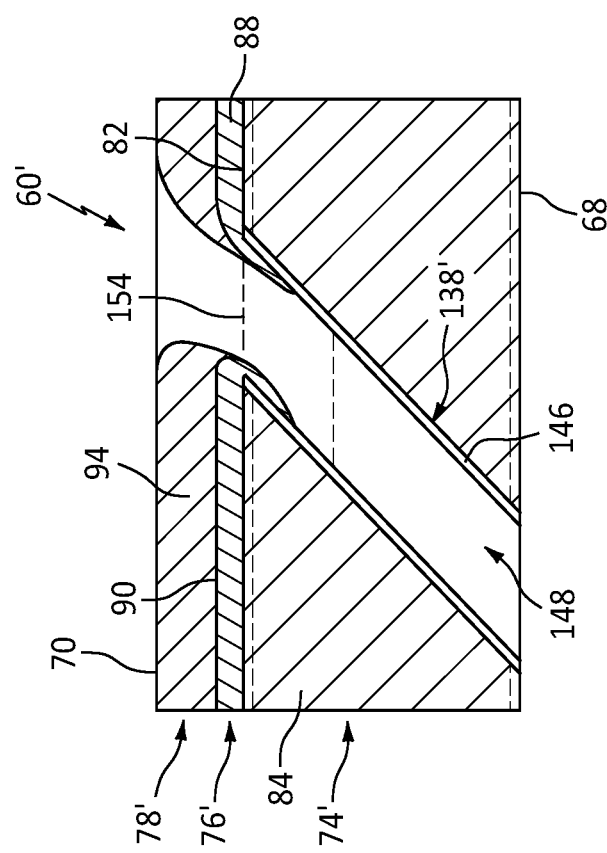

Depending upon the outer coating material 94, the outer coating thickness 92 (see FIG. 3) and/or the outer coating application technique, the outer coating material 94 may at least partially or completely (e.g., further) cover or otherwise cap/plug the preform aperture end 154 of the preform aperture 148. Alternatively, at least a portion or an entirety of the preform aperture end 154 may remain open (e.g., uncovered, unplugged) as shown, for example, in FIGS. 13B and 13C.

The combination of the preform substrate 74', the preform internal coating 138', the preform inner coating 76' and the preform outer coating 78' may provide a preform component 60'. This preform component 60' of FIG. 13 may generally have the configuration of the fluid cooled component 60 to be formed (e.g., see FIGS. 3 and 7). The preform component 60' of FIG. 13, however, does not include any holes for forming the diffuser sections 104.

In step 812, at least a portion of the preform component 60' is scanned with a non-contact, non-destructive imaging system 156. Referring to FIG. 14, this imaging system 156 may be configured as a microwave imaging system.

The imaging system 156 of FIG. 14 may include a microwave transceiver 158 (or a transmitter and a receiver). This transceiver 158 (or the transmitter) is configured to direct (e.g., transmit) microwaves (e.g., 157A) into the preform component 60' from the exterior of the preform component 60'. These microwaves include electromagnetic waves with a predetermined frequency (or frequency range) within a microwave frequency ban of three-hundred mega-Hertz (300 MHz) and three-hundred giga-Hertz (300 GHz). The specific frequency (or frequency range) may be selected/tuned based on the material composition of the preform component 60' and/or the specific geometric configuration of the preform aperture 148. For example, the microwaves may be selected to travel through portions (certain component materials) of the preform component 60'. However, the microwaves may be selected to reflect against other portions (certain component materials and/or gas pockets formed by the preform aperture 148) of the preform component 60'. The microwaves may also or alternatively be selected to reflect against certain geometric features; e.g., surfaces, etc. At least some of the reflected microwaves (e.g., 157B) may travel back to and may be received by the transceiver 158 (or the receiver). The imaging system 156 may transmit information associated with the reflected microwaves as scan data—imaging system output data.

The scan data may be indicative of an internal structure of the scanned portion of the preform component 60'. The scan data, for example, may be used to provide a feature map of the internal structure of the scanned portion of the preform component 60'. This feature map may include locations and/or dimensional information for the preform aperture 148. The feature map may also or alternatively include locations and/or dimensional information for one or more of the coatings and/or the preform substrate 74'. With this information, a processing system 159 (e.g., a computer system) may determine a location and/or an orientation of the preform aperture 148, or at least the end 154 thereof, relative to the preform component 60' and/or a coordinate system.

Figure 15:
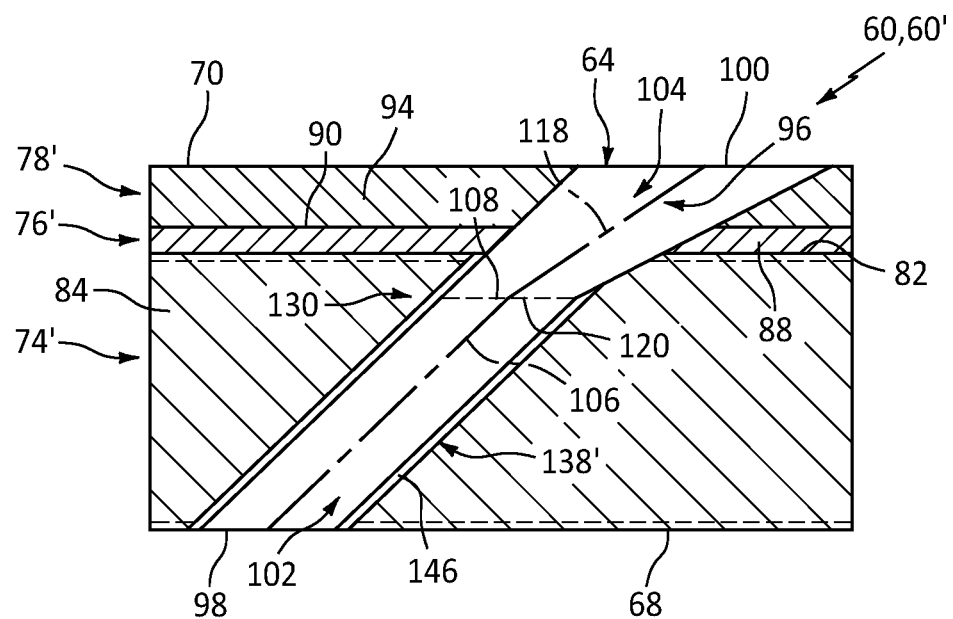
FIG. 15 is a sectional illustration of a portion of the preform substrate configured with a diffuser section.

In step 814, the diffuser section 104 of the respective cooling aperture 64 is formed in the preform component 60' using the scan data as shown, for example, in FIG. 15. For example, since the preform aperture 148 may be completely covered or otherwise obscured by one or more of the external coatings 76' and 78' (see FIG. 14), the scan data and the preform aperture location and/or orientation information determined therefrom may be used to locate a position of where and/or an orientation of how the diffuser section 104 should be formed in the preform component 60'. The diffuser section 104 may then be formed at this location/orientation such that the diffuser section 104 substantially or completely aligns with the meter section 104 of the same respective cooling aperture 64.

Figure 16:
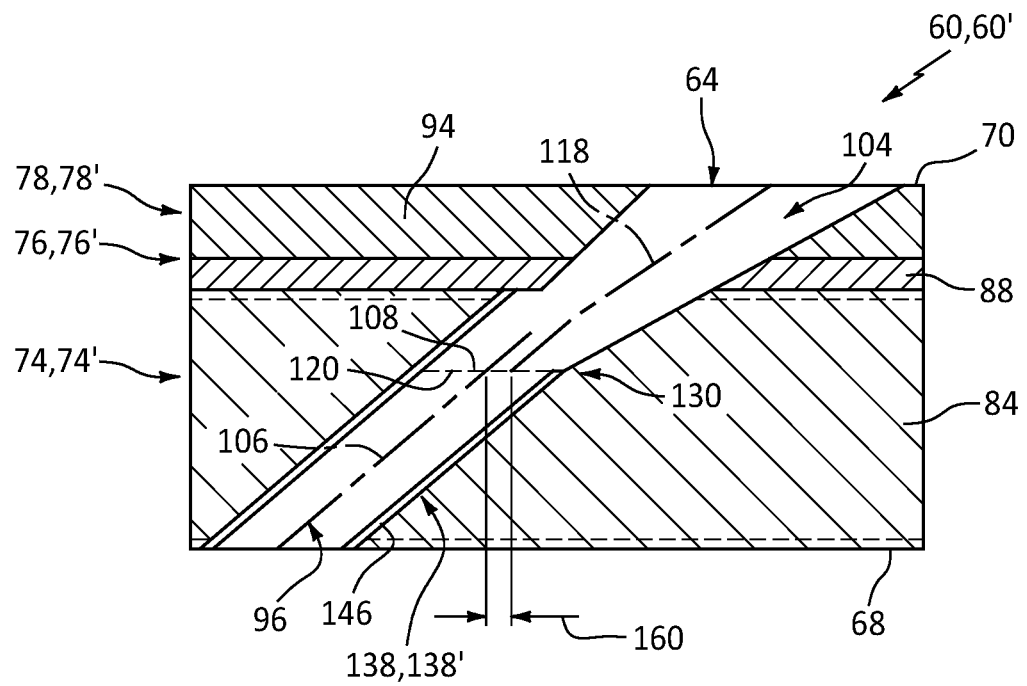
FIG. 16 is a sectional illustration of a portion of the preform substrate configured with a cooling aperture having a slight misalignment between its meter section and its diffuser section.

Referring to FIG. 7, when properly aligned, the diffuser segment 118 of the longitudinal centerline 96 may be coincident with the meter segment 106 of the longitudinal centerline 96 at the interface 130. The orifices 108 and 120 may thereby be (e.g., completely) aligned (e.g., in the x-y plane). However, referring to FIG. 16, there may be acceptable alignment between the diffuser section 104 and the meter section 102 where, for example, a lateral misalignment 160 between the longitudinal centerline segments 106 and 118 at the interface 130 is less than a (e.g., predetermined) threshold. The orifices 108 and 120 may thereby be slightly misaligned, but still within design specifications for example.

Referring again to FIG. 15, a portion of the outer coating material 94, a portion of the inner coating material 88 and a portion of the underlying substrate material 84 is machined away (from the exterior of the preform component 60') to provide the respective diffuser section 104. The diffuser section 104 may be formed in the various materials of the preform component 60' using a diffuser section machining process. This diffuser section machining process is selected to form the diffuser section 104 in the various different electrically conductive and non-electrically conductive materials in the preform component 60'. The diffuser section machining process is also selected to provide the diffuser section 104 with a precise finish geometry. Examples of the diffuser section machining process include, but are not limited to, a laser machining (e.g., ablation) process, a water-jet guided laser (WJGL) machining process, an abrasive water jet (AWJ) machining process, an electron beam machining process, and a mechanical drilling process. Following this formation step 814, the respective diffuser section 104 may be fully formed in the preform component 60', which may now be the fully formed fluid cooled component 60.

The method 800 is described above as partially forming a portion of the diffuser section 104 by forming the preform aperture 148 (see FIG. 10) in the step 804. However, in other embodiments, a respective portion of the diffuser section 104 may be completely formed within the preform substrate 74' such that the downstream side surface segment 144 of the diffuser section 104 (see FIG. 7) is also coated with the internal coating material 146 during the coating step 806.

In some embodiments, the scanning step 812 may be replaced by (or performed in conjunction with) a modeling step. For example, a processing system (e.g., the system 159) may computationally model one or more of the external preform coatings 76', 78' over the preform substrate 74' (prior to or following application of those coatings 76', 78') to predict a geometry of the preform component 60'. More particularly, the processing system may model predicted changes in the external preform coatings 76', 78' over the preform substrate 74' due to, for example, manufacturing tolerances. Using this information, the processing system may more accurately locate the position and/or the orientation of the preform aperture 148 and its meter section 102 within the preform component 60', even where apertures 148, 102 are covered or otherwise visually obscured by the external preform coatings 76', 78'. Model data associated with the modeling may thereby be used to form a respective diffuser section 104 in the preform component 60' aligned with the meter section 102.

The modeling may be performed using artificial intelligence (AI). The modeling may also or alternatively be performed using machine learning where, for example, information learned from manufacturing one or more previous fluid cooled components 60 may be applied to manufacturing of the present fluid cooled component 60.

For ease of description, the method 800 is described above with respect to formation of a single cooling aperture 64 of the fluid cooled component 60. However, the fluid cooled component 60 may be formed with multiple of the cooling apertures 64, for example, by repeating the steps 804 and 814. For example, the step 804 may be repeated multiple times before the coating steps 806, 808 and 810. The step 814 may then be repeated multiple times following the scanning step 812.

Figure 17:
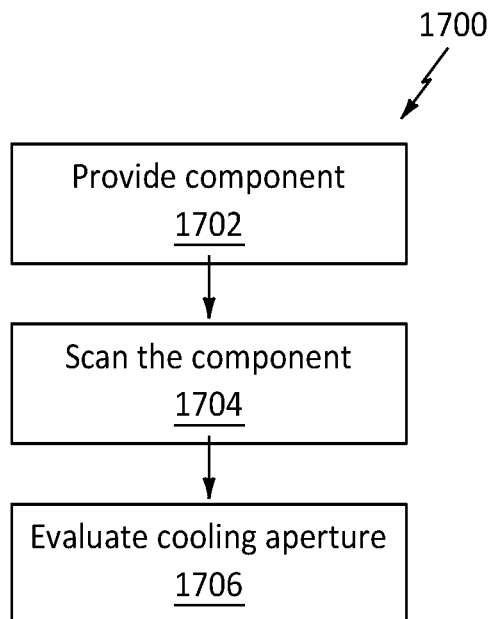
FIG. 17 is a flow diagram of a method for inspecting a fluid cooled component.

FIG. 17 is a flow diagram 1700 of a method for inspecting a fluid cooled component. For ease of description, the method 1700 is described below with reference to the fluid cooled component 60 described above. The method 1700 of the present disclosure, however, is not limited to inspecting such an exemplary fluid cooled component.

In step 1702, the fluid cooled component 60 is provided.

In step 1704, at least a portion of the fluid cooled component 60 is scanned using the imaging system 156. This scanning step 1704 may be performed in a similar manner as described above with respect to the scanning step 812 to provide scan data. This scan data may be indicative of alignment between the diffuser section 104 and the meter section 102 of a respective one (or more) of the cooling apertures 64.

In step 1706, the scan data is processed to evaluate the alignment between the diffuser section 104 and the meter section 102 of a respective one (or more) of the cooling apertures 64. For example, the processing system 159 may determine the diffuser section 104 and the meter section 102 are properly aligned when the longitudinal centerline segments 106 and 118 are coincident at the interface 130 (e.g., see FIG. 15). The processing system 159 may determine the diffuser section 104 and the meter section 102 satisfying a design specification when, for example, the lateral misalignment 160 of FIG. 16 between the longitudinal centerline segments 106 and 118 at the interface 130 is less than a (e.g., predetermined) threshold. However, the processing system 159 may determine the diffuser section 104 and the meter section 102 are misaligned and out of (e.g., does not satisfy) the design specification when, for example, the lateral misalignment 160 of FIG. 16 between the longitudinal centerline segments 106 and 118 at the interface 130 is equal to or greater than the threshold. Note, this threshold may have different values at different locations circumferentially about the interface (e.g., in the x-y plane).

The processing system 159 may subsequently provide an indication of alignment. When alignment between the sections 102 and 104 is acceptable, then the fluid cooled component 60 may be identified for further downstream processing and/or service; e.g., installation within the turbine engine 20. However, where the alignment between the sections 102 and 104 is not acceptable (e.g., for a single cooling aperture 64, or for a certain number of cooling apertures 64 of a respective component 60), then the fluid cooled component 60 may be returned for further processing and/or scrapped.

The method 800 and the method 1700 are described above with reference to a microwave imaging system for locating a hole beneath coating(s) 76, 78 and/or locating a true center of a hole partially obscured by the coating(s) 76, 78. The present disclosure, however, is not limited to such an exemplary imaging system. For example, the scanning may also or alternatively be performed by other non-contact, non-destructive imaging systems such as, but not limited to, a micro computed tomography (micro-CT) imaging system, a terahertz imaging system, a flash thermography system, etc.

While various embodiments of the present disclosure have been described, it will be apparent to those of ordinary skill in the art that many more embodiments and implementations are possible within the scope of the disclosure. For example, the present disclosure as described herein includes several aspects and embodiments that include particular features. Although these features may be described individually, it is within the scope of the present disclosure that some or all of these features may be combined with any one of the aspects and remain within the scope of the disclosure. Accordingly, the present disclosure is not to be restricted except in light of the attached claims and their equivalents.

What is claimed is:

1. A manufacturing method, comprising:
providing a preform component for a turbine engine, the preform component comprising a substrate;
forming a meter section of a cooling aperture in the substrate;
applying an internal coating onto a surface of the meter section;
applying an external coating over the substrate; and
forming a diffuser section of the cooling aperture in the external coating and the substrate to provide the cooling aperture.

2. The manufacturing method of claim 1, wherein the internal coating comprises an aluminide coating.

3. The manufacturing method of claim 1, wherein
the substrate comprises metal; and
the external coating comprises ceramic.

4. The manufacturing method of claim 1, further comprising:
applying a bond coating onto the substrate;
wherein the external coating is applied onto the bond coating; and
wherein the diffuser section is further formed through the bond coating.

5. The manufacturing method of claim 4, wherein
the bond coating comprises MCrAlY or MAlCrX;
the M comprises at least one of nickel (Ni), cobalt (Co) or iron (Fe); and
the Y or the X comprises at least one of hafnium (Hf), yttrium (Y) or silicon (Si).

6. The manufacturing method of claim 1, further comprising:
applying a bond coating onto at least a portion of the internal coating;
wherein the external coating is applied onto the bond coating; and
wherein the diffuser section is further formed through the bond coating.

7. The manufacturing method of claim 1, wherein the meter section is formed using an electrical discharge machining process.

8. The manufacturing method of claim 1, wherein the diffuser section is formed using a laser machining process.

9. The manufacturing method of claim 1, wherein the preform component comprises a preform of an airfoil for the turbine engine.

10. The manufacturing method of claim 1, wherein the preform component comprises a preform of a flowpath wall for the turbine engine.

11. The manufacturing method of claim 1, further comprising:

modeling the external coating to predict a geometry of the preform component following the application of the external coating;

wherein the diffuser section is formed in the external coating and the substrate based on the predicted geometry.

12. The manufacturing method of claim 11, wherein the modeling is performed using artificial intelligence.

13. The manufacturing method of claim 11, wherein the modeling is performed using machine learning.

14. The manufacturing method of claim 1, further comprising:

scanning at least a portion of the substrate, the internal coating and the external coating with an imaging system to provide scan data indicative of an internal structure of the portion of the substrate, the internal coating and the external coating; and wherein the diffuser section is formed in the external coating and the substrate based on the scan data.

15. The manufacturing method of claim 14, wherein the imaging system comprises a microwave imaging system.

16. A manufacturing method, comprising:

providing a preform component for a turbine engine, the preform component comprising a substrate;

machining a meter section into the substrate;

lining at least a portion of the meter section with an internal coating to provide a lined meter section of a cooling aperture;

forming an external coating over the substrate with the lined meter section; and machining at least a portion of a diffuser section of the cooling aperture into the external coating.

17. The manufacturing method of claim 16, wherein
the substrate comprises metal;
the internal coating comprises an aluminide coating; and
the external coating comprises ceramic.

* * * * *